(12) United States Patent
Noguchi

(10) Patent No.: US 6,341,086 B2
(45) Date of Patent: Jan. 22, 2002

(54) SEMICONDUCTOR MEMORY CIRCUIT INCLUDING A DATA OUTPUT CIRCUIT

(75) Inventor: Hidekazu Noguchi, Saitama (JP)

(73) Assignee: Oki Electric Industry Co., Ltd., Minato-ku (JP)

( * ) Notice: Subject to any disclaimer, the term of this patent is extended or adjusted under 35 U.S.C. 154(b) by 0 days.

(21) Appl. No.: 09/769,425

(22) Filed: Jan. 26, 2001

(30) Foreign Application Priority Data

Apr. 19, 2000 (JP) ............................................ 12-117987

(51) Int. Cl.[7] ................................................ G11C 7/00
(52) U.S. Cl. .................... 365/189.05; 365/233; 365/205
(58) Field of Search ........................... 365/189.05, 233, 365/205, 230.08

(56) References Cited

U.S. PATENT DOCUMENTS

| | | | | |
|---|---|---|---|---|
| 4,849,937 A | * | 7/1989 | Yoshimoto | ................... 365/233 |
| 5,311,471 A | * | 5/1994 | Matsumoto et al. | ......... 365/205 |
| 5,877,990 A | * | 3/1999 | Kim | ....................... 365/189.05 |

* cited by examiner

Primary Examiner—Huan Hoang
(74) Attorney, Agent, or Firm—Venable; Robert J. Frank

(57) ABSTRACT

A semiconductor memory circuit comprises a sense amplifier, a first data storing circuit for temporally storing and outputting the data from the sense amplifier in response to a latch signal and erasing the stored data in response to a first clear signal, a first determination circuit for determining whether the first data storing circuit stores the data and outputting a first determination signal representing the determination. The semiconductor memory circuit further comprises an output data bus, a first transfer circuit transferring the data output from the first data storing circuit to the output data bus in response to the first determination signal, a first clear signal generation circuit for generating the first clear signal in response to the first determination signal, a second data storing circuit for temporally storing and outputting the data output from the first data storing circuit in response to the latch signal and erasing the stored data in response to a second clear signal, a second determination circuit for determining whether the second data storing circuit stores the data and outputting a second determination signal representing the determination, a second transfer circuit for transferring the data output from the second data storing circuit to the data bus in response to the second determination signal and a second clear signal generation circuit for generating the second clear signal in response to the second determination signal.

14 Claims, 5 Drawing Sheets

SEMICONDUCTOR MEMORY CIRCUIT INCLUDING A DATA OUTPUT CIRCUIT

BACKGROUND OF THE INVENTION

The present invention relates to a semiconductor circuit including a data output circuit, and particularly to a data output circuit capable of outputting data rapidly.

A synchronous dynamic random access memory (herein after "SDRAM") operates synchronized with a clock signal supplied from the outside. A frequency of the supplied clock signal of the SDRAM tends to be high since the frequency of the clock signal controls an operation speed of the SDRAM.

Data of the SDRAM are output in synchronous with the clock signal after a certain number of clock pulses are passed after a read command signal is input. The certain number is called as CAS latency (herein after "CL").

In the SDRAM, the data are amplified by a sense amplifier located near an output circuit. Then, the amplified data are output from the output circuit. When the read command signal is input, the data are transferred to the sense amplifier in response to the clock signal and the transferred data are amplified by the sense amplifier. The amplified data are transferred to the output circuit. The output circuit is controlled by a control signal that is synchronized with the clock signal. The data are finally output in response to the clock signal.

A read out time from a memory cell does not depend on a cycle of the clock signal. Therefore, a data storing circuit capable of corresponding wide range clock cycle which does not relate to a number of CL is required for the purpose of outputting data after CL is passed from the input of the read command.

Further, where the SDRAM operates in synchronous with leading edges and falling edges of the clock signal, the control signals should be synchronized with the leading edges and the falling edges of the clock signal. Therefore, circuit configuration of the control circuit turns complex.

SUMMARY OF THE INVENTION

With the foregoing problems in view, it is an object of the present invention to provide an output circuit which can operate with high speed even though the cycle of the clock signal turns short.

It is another object of the present invention to provide an output circuit which can operate in synchronous with the leading edges and the falling edges of the clock signal.

A semiconductor memory circuit according to the present invention comprises a sense amplifier, a first data storing circuit for temporally storing and outputting the data from the sense amplifier in response to a latch signal and erasing the stored data in response to a first clear signal, a first determination circuit for determining whether the first data storing circuit stores the data and outputting a first determination signal representing the determination. The semiconductor memory circuit further comprises an output data bus, a first transfer circuit transferring the data output from the first data storing circuit to the output data bus in response to the first determination signal, a first clear signal generation circuit for generating the first clear signal in response to the first determination signal, a second data storing circuit for temporally storing and outputting the data output from the first data storing circuit in response to the latch signal and erasing the stored data in response to a second clear signal, a second determination circuit for determining whether the second data storing circuit stores the data and outputting a second determination signal representing the determination, a second transfer circuit for transferring the data output from the second data storing circuit to the data bus in response to the second determination signal and a second clear signal generation circuit for generating the second clear signal in response to the second determination signal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFFERED EMBODIMENTS

Preferred embodiments of the present invention will hereinafter be described in detail with reference to the accompanying drawings.

Figure 1:
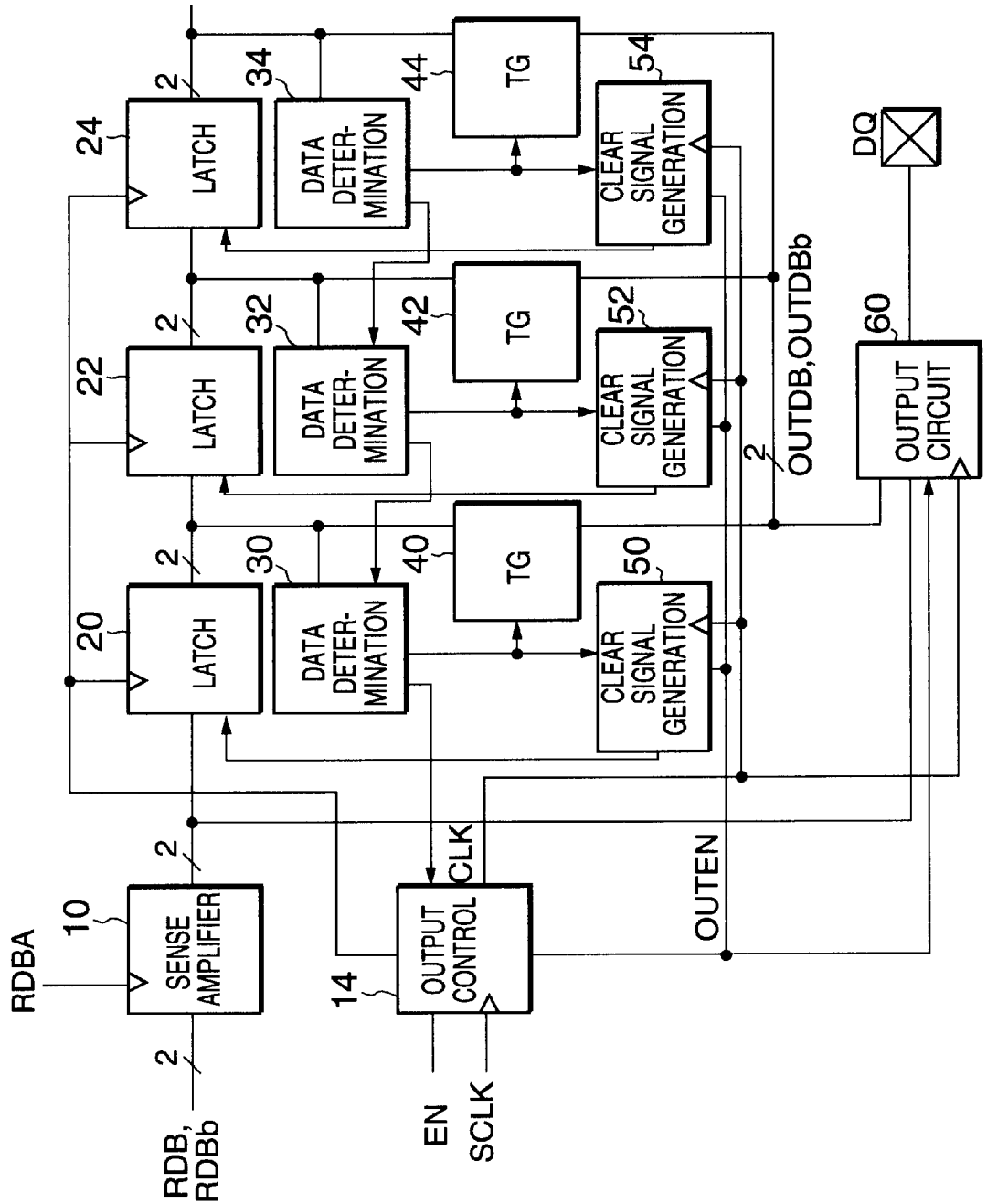
FIG. 1 is a circuit block diagram showing a semiconductor memory circuit according to an embodiment of the present invention.

FIG. 1 is a circuit block diagram showing a semiconductor memory circuit according to an embodiment of the present invention.

A pair of read out data buses RDB and RDBb transfer data that are read out from memory cells not shown in FIG. 1. The read out data buses RDB and RDBb are connected to a sense amplifier 10 which amplifies the data read out from the memory cells. In FIG. 1, the data buses RDB and RDBb are illustrated as a single line with an indication of /2 which means two lines.

An activate signal RDBA is input to the sense amplifier 10. The sense amplifier 10 is connected to a first data storing circuit 20 through the data buses RDB and RDBb. The data storing circuit is controlled by a latch clock signal LCLK that is transferred from an output control circuit 14.

The output control circuit 14 receives a synchronous clock signal SCLK that controls the entire SDRAM, a control signal EN and other control signals and timing signals not shown in FIG. 1. The output control circuit 14 generates and outputs the latch clock signal LCLK, an output control signal OUTEN and an output clock signal CLK in response to the received signal thereto.

The first data storing circuit 20 has an output terminal connected to an input terminal of a second storing circuit 22. The second data storing circuit 22 has an output terminal connected to an input terminal of a third data storing circuit 24. The second and third data storing circuits 22 and 24 are controlled by the latch clock signal LCLK in the same manner as the first data storing circuit 20. In FIG. 1, an output terminal of the third storing circuit 24 is not connected to any other circuit. However, a number of the data storing circuit can be increased, if necessary.

The output terminal of the first data storing circuit 20 is connected to a first data existence determination circuit 30. The data existence determination circuit determines the existence of the data output from the data storing circuit and output a result of the determination. A first output terminal of the first data existence determination circuit 30 is connected to the output control circuit 14. In the same manner, the output terminals of the second and third storing circuits 22 and 24 are connected to the second and third data existence determination circuits 31 and 34, respectively.

A second output terminal of the first data existence determination circuit 30 is connected to a first data transfer circuit 40. The data transfer circuit transfers the data output from the data storing circuit to a pair of output data buses OUTDB and OUTDBb. The data transfer circuit is controlled by the data existence determination circuit. In the same manner, the second output terminals of the second and third data existence determination circuits are connected to second and third data transfer circuits 41 and 44, respectively.

The output data buses OUTDB and OUTDBb are connected to an output circuit 60. The output circuit 60 is connected to the sense amplifier 10. The output circuit 60 outputs data to a data output terminal DQ in response to the output clock signal CLK and the output control signal OUTEN from the output control circuit 14.

A first clear signal generation circuit 50 is controlled by the first data existence determination circuit 30. The clear signal generation circuit generates and outputs a clear signal to the data storing circuit for erasing the data stored in the data storing circuit. The clear signal generation circuit is controlled by the output signal of the data existence determination circuit, the output clock signal CLK, the output control signal OUTEN output from the output control circuit 14. The second and third clear signal generation circuits 52 and 54 are controlled by the second and third data existence determination circuits 32 and 34, and output clear signals to the second and third data storing circuits 22 and 24, respectively, in the same manner as the first clear signal generation circuit 50.

Figure 2:
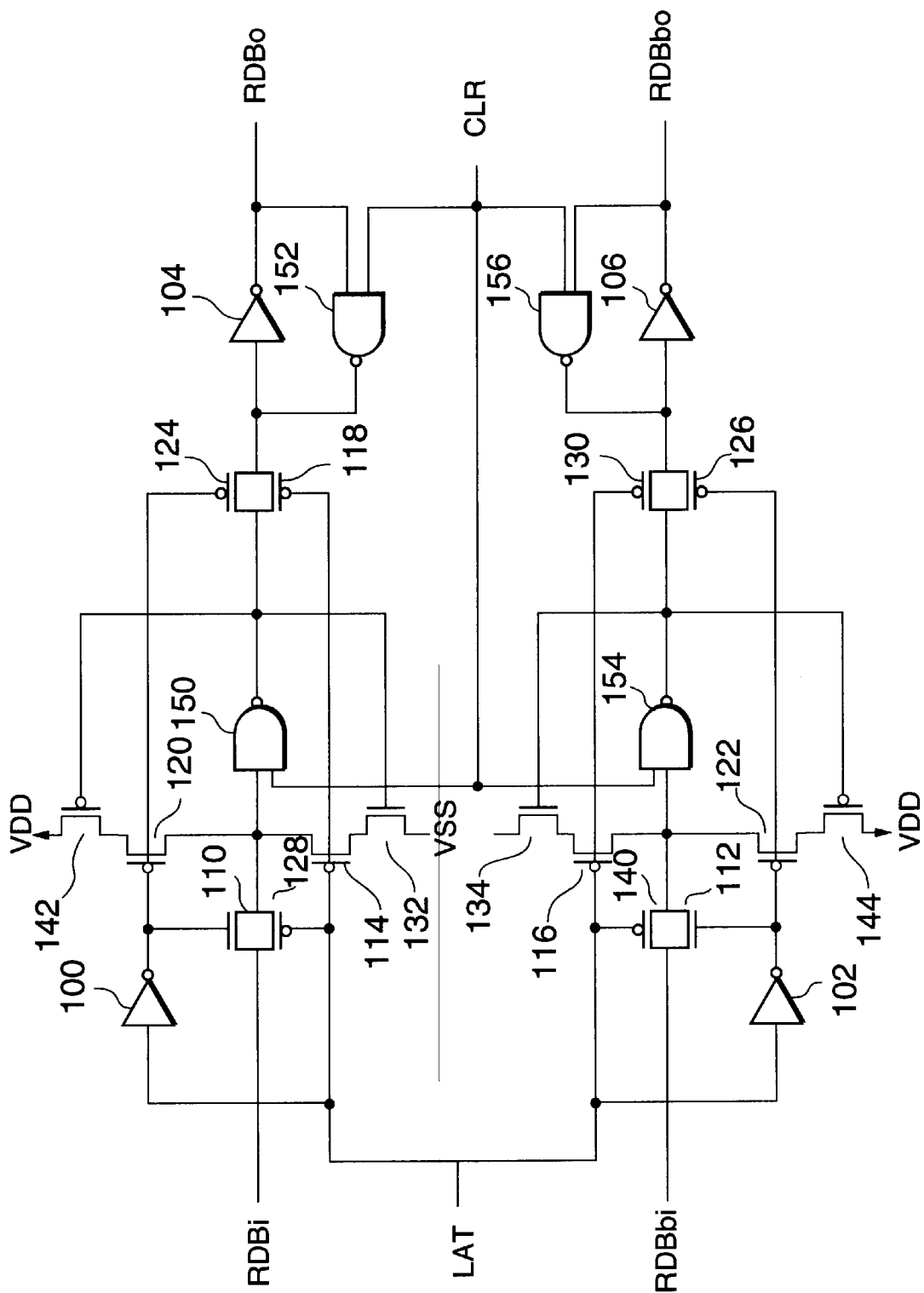
FIG. 2 is a circuit diagram of a latch circuit shown in FIG. 1.

FIG. 2 is a circuit diagram showing a circuit configuration of the data storing circuit shown in FIG. 1. Since the first to third data storing circuit 20, 22 and 24 has the same circuit configuration, FIG. 2 shows one of them.

The data storing circuit has input nodes RDBi, RDBbi which are connected to the output data buses. A clock input terminal LAT of the data storing circuit receives the latch clock signal LCLK. A clear signal input terminal CLR of the data storing circuit receives the clear signal transferred from the clear signal generation circuit. The data stored in the data storing circuit are output from output nodes RDBo, RDBbo.

Inputs terminals of inverters 100 and 102 are connected to the clock input terminal LAT. Outputs terminals of the inverters 100 and 102 are connected to gates of PMOS transistors 120, 122, 124 and 126. The clock input terminal is further connected to gates of NMOS transistors 114, 116, 118 and 130 and PMOS transistors 128 and 140.

The input node RDBi of the data storing circuit is connected to one node of a first transfer gate which is comprised of the NMOS transistor 110 and the PMOS transistor 128. The other node of the first transfer gate is connected to one terminals of the NMOS transistor 114 and PMOS transistor 120 and a first terminal of a NAND gate 150. A second input terminal of the NAND gate 150 is connected to the clear input terminal CLR. An output terminal of the NAND circuit 150 is connected to the gates of the NMOS transistor 132 and the PMOS transistors 142 and one node of a second transfer gate which is comprised of the NMOS transistor 118 and the PMOS transistor 124. A first terminal of the NMOS transistor 132 is connected to a second terminal of the NMOS transistor 114. A first electric potential VSS is applied to a second terminal of the NMOS transistor 132. A first terminal of the PMOS transistor 142 is connected to a second terminal of the PMOS transistor 120. A second electric potential VDD is applied to a second terminal of the PMOS transistor 142.

The other node of the second transfer gate is connected to an input terminal of an inverter 104. The output terminal of the inverter 104 is connected to one node of the output node RDBO of the data storing circuit and a first input terminal of a NAND circuit 152. A second input terminal of the NAND circuit 152 is connected to the clear input terminal CLR. An output terminal of the NAND circuit 152 is connected to an input terminal of the inverter 104.

The other node RDBbi of the data storing circuit is connected to one node of a third transfer gate which is comprised of the NMOS transistor 112 and the PMOS transistor 140. The other node of the third transfer gate is connected to one terminals of the NMOS transistor 116 and the PMOS transistor 122 and a first input terminal of a NAND circuit 154. A second input terminal of the NAND circuit 154 is connected to the clear input terminal CLR. An output terminal of the NAND circuit 154 is connected to gates of the NMOS transistor 134 and the PMOS transistor 144, and one node of a fourth transfer gate which is comprised of an NMOS transistor 130 and a PMOS transistor 126. A first terminal of the NMOS transistor 134 is connected to a second terminal of the NMOS transistor 116. The first electric potential VSS is applied to a second terminal of the NMOS transistor 134. The second electric potential VDD is applied to a second terminal of the PMOS transistor 144.

The other node of the fourth transfer gate is connected to an input terminal of an inverter 106. An output terminal of the inverter 106 is connected to the other node RDBbo of the data storing circuit and a first input terminal of a NAND circuit 156. A second input terminal of the NAND circuit 156 is connected to the clear input terminal CLR. An output terminal of the NAND circuit 156 is connected to an input terminal of the inverter 106.

Next, an operation of the data storing circuit shown in FIG. 2 will be explained.

Where the data storing circuit is in operation, the clear signal supplied to the clear input terminal CLR is in "H" level. Therefore, the NAND circuits 150, 152, 154 and 156 works as inverters. Where the data are not input to the data storing circuit, "L" level is supplied to both of the input node RDBi and RDBbi. On the other hand, where the data are input to the data storing circuit, "H" level is supplied to both of the input node RDBi and RDBbi.

As understood from FIG. 2, circuit configurations of circuits connected to one input node RDBi and the other input node RDBbi are the same. Therefore, an operation of the circuit connected to the input node RDBi where "H" level is applied to the input node RDBi will be explained for the operation of the data storing circuit.

When "L" level signal is applied to the clock input terminal LAT, "H" level signal is applied to the gate of the NMOS transistor 110 and "L" level signal is applied to the gate of the PMOS transistor 128. Therefore, the first transfer gate is in ON state, and the first input terminal of the NAND circuit 150 receives "H" level signal. Since "H" level signal is applied to the second input terminal of the NAND circuit 150, the NAND circuit 150 outputs "L" level signal. Further, since "H" level signal is applied to the gate of the PMOS transistor 120 and "L" level signal is applied to the gate of the NMOS transistor 132, the first input terminal of the NAND circuit 150 is connected only to one input node RDBi of the data storing circuit. "H" level signal is applied to the gate of the PMOS transistor 124 and "L" level signal is applied to the gate of the NMOS transistor 118. Therefore, the second transfer gate is in OFF state and output signal of the NAND gate 150 is not transferred to the inverter 104.

Next, a signal applied to the clock input terminal LAT turns "L" level to "H" level. "L" level signal is applied to the gate of the NMOS transistor 110 and "H" level signal is applied to the gate of the PMOS transistor 128. Then, the first transfer gate turns OFF. However, since "L" level signal is applied to the gates of the PMOS transistor 120 and 124 and "L" level signal is applied to the gate of the NMOS transistor 132, the second electric potential VDD is applied to the first input terminal of the NAND circuit 150 and the NAND circuit 150 keep to output "L" level signal.

"L" level signal is applied to the gate of the PMOS transistor 124 and "H" level signal is applied to the gate of the NMOS transistor 118. Therefore, the second transfer gate turns ON and the output signal of the NAND circuit 150 is transferred to the inverter 104. The inverter 104 outputs "H" level signal to the output node RDBo of the data storing circuit and the first input terminal of the NAND circuit 152. Since the clear signal having "H" level is applied to the second input terminal of the NAND circuit 152, the NAND circuit 152 outputs "L" level signal to the inverter 104. Therefore, the inverter 104 and NAND circuit 152 store the data input thereto.

The "L" level signal input to the other node RDBbi of the data storing circuit is stored in the inverter 106 and NAND circuit 156 in the same manner as explained above (the VSS level is applied to the NAND circuit 154).

Further, when the clear signal having "L" level is input, NAND circuits 150, 152, 154 and 156 output "H" level signal regardless of the level of the other signals. Therefore, the data storing circuit stores "L" level data.

Figure 3:
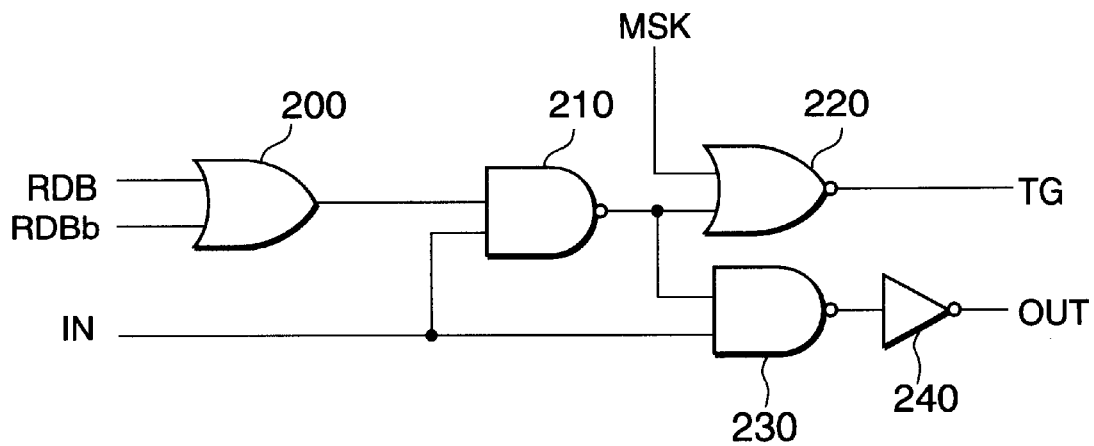
FIG. 3 is a circuit diagram of a data determination circuit shown in FIG. 1.

FIG. 3 is a circuit diagram showing a circuit configuration of the data existence determination circuit shown in FIG. 1. Since the first to third data existence determination circuit 30, 32 and 34 has the same circuit configuration, FIG. 3 shows one of them.

The data existence determination circuit is connected to the output o f the corresponding data storing circuit. The data buses RDB and RDBb connected between the data storing circuits are connected to first and second input terminals of an OR circuit 200. An output terminal of the OR circuit 200 is connected to a first input terminal of a NAND circuit 210. A second input terminal of the NAND circuit 210 is connected to an input node IN. The input node IN is connected to the output terminal of next stage data existence determination circuit (for example, the input node IN of the first data existence determination circuit 30 is connected to the output terminal of the second data existence determination circuit). "H" level signal is applied to the input node IN of the final stage data existence determination circuit (For example, the third data existence determination circuit 34 in FIG. 1).

An output terminal of the NAND circuit 210 is connected to a first input terminal of a NOR circuit 220 and a first input terminal of a NAND circuit 230. A second input terminal of the NOR circuit 220 is connected to a transfer inhibit signal input node MS which is not shown in FIG. 1. An output terminal of the NOR circuit 220 is connected to the data transfer circuit and the clear signal generation circuit through an data transfer output node TG.

A second input terminal of the NAND circuit 230 is connected to the input node IN. An output terminal of the NAND circuit 230 is connected to an output node OUT through an inverter 240. The output node OUT is connected to the input terminal of the previous stage data existence determination circuit (for example, the output node OUT of the second data existence determination circuit 32 is connected to the input terminal of the first data existence determination circuit 30). If there is no previous data existence determination circuit, the output node OUT is connected to the output control circuit 14 (for example, the output node of the first data existence determination circuit 30 in FIG. 1 is connected to the output control circuit 14).

Next, the operation of the data existence determination circuit will be explained.

If the data storing circuit outputs its stored data, either one of the data buses receives "H" level signal. Therefore, the OR circuit outputs "H" level signal. Then, where the second input terminal of the NAND circuit 210 receives "H" level signal from the next stage data existence determination circuit through input node IN, the NAND circuit 210 outputs "L" level output signal. Then, the NOR circuit 220 outputs a signal which is inverted the signal received at the transfer inhibit signal input node MSK. During a short period of time when the latch clock signal LCLK turns "L" level to "H" level, that is, at a moment or certain short period when the data storing circuit starts to latch the data, the signal input in the transfer inhibit signal input node MSK has "H" level. Therefore, "H" level signal is applied at the data transfer output node TG except a moment when the data storing circuit starts to latch the data. Since the NAND circuit 230 receives "L" level signal at its first input terminal and "H" level signal at its second input terminal, it outputs "H" level signal from its output terminal. The output signal of the NAND circuit 230 is inverted by the inverter 240. Then, the output signal of "L" level is output from the output node OUT.

If the data existence determination circuit receives "L" level signal at its input node IN from the next stage data existence determination circuit, the NAND circuit 210 outputs "H" level signal regardless the level of the signal output from the OR circuit 200. Then, the NOR circuit 220 outputs "L" level signal to the data transfer output node TG regardless the level of the signal input to the transfer inhibit signal input node MSK. Since the NAND circuit 230 receives "H" level signal at its first input terminal and "H" level signal at its second input terminal, it outputs "L" level signal from its output terminal. The output signal of the NAND circuit 230 is inverted by the inverter 240. Then, the output signal of "H" level is output from the output node OUT.

If the data storing circuit does not output data, both of the data buses receives "L" level signal. Therefore, the OR circuit outputs "L" level signal. The NAND circuit 210 outputs "H" level signal regardless the level of the signal at the input node IN. The NOR circuit 220 outputs "L" level signal to the data transfer output node TG regardless the level of the signal received at the transfer inhibit signal input node MSK. Since the NAND circuit 230 receives "H" level signal at its first input terminal, it outputs an inverted signal of the signal input to the input node IN. The output signal of the NAND circuit 230 is inverted by the inverter 240. Then, the signal input to the input node IN is output from the output node OUT.

In every time, since "H" level signal is supplied to the input node IN of the final stage data existence determination circuit, it outputs "H" level signal at its output node OUT as an initial status. Therefore, the nearest data existence determination circuit from the final stage data existence determination circuit outputs "L" level signal at its output node OUT and "H" level signal at the data transfer output node TG among the data existence determination circuits determine the data output from the data storing circuits. The other data existence determination circuits outputs "H" level signal at its output node OUT and "L" level signal at the data transfer output node TG.

Figure 4:
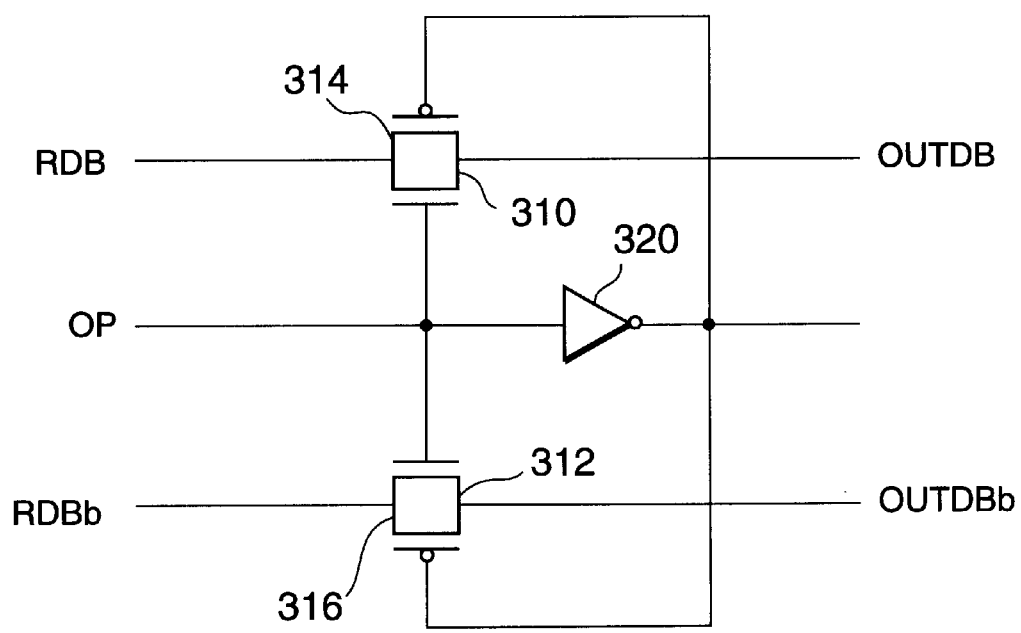
FIG. 4 is a circuit diagram of a transfer circuit shown in FIG. 1.

FIG. 4 is a circuit diagram showing a circuit configuration of the data transfer circuit shown in FIG. 1. Since the first to third data transfer circuits 40, 42 and 44 has the same circuit configuration, FIG. 4 shows one of them.

The data transfer circuit controls the connection/disconnection between the data buses RDB and RDBb which transfer the data from the data storing circuit and the output data buses OUTDB and OUTDBb. An input node OP of the data transfer circuit is connected to gates of NMOS transistors 310 and 312 and an input terminal of an inverter 320. An output terminal of the inverter 320 is connected to gates of PMOS transistors 314 and 316.

The NMOS transistor 310 and PMOS transistor 314 consist of a first transfer gate which is connected between one of the data buses RDB and one of the output data buses OUTDB. The NMOS transistor 312 and PMOS transistor 316 consist of a second transfer gate which is connected between the other data bus RDBb and the other output data bus OUTDBb.

Next, the operation of the data transfer circuit will be explained.

When "H" level signal is input to the input node OP, NMOS transistors 310 and 312 and PMOS transistors 314 and 316 turns ON. Therefore, the data buses RDB and RDBb and the output data buses OUTDB and OUTDBb are electrically connected.

When "L" level signal is input to the input node OP, NMOS transistors 310 and 312 and PMOS transistors 314 and 316 turns OFF. Therefore, the data buses RDB and RDBb and the output data buses OUTDB and OUTDBb are electrically disconnected.

Figure 5:
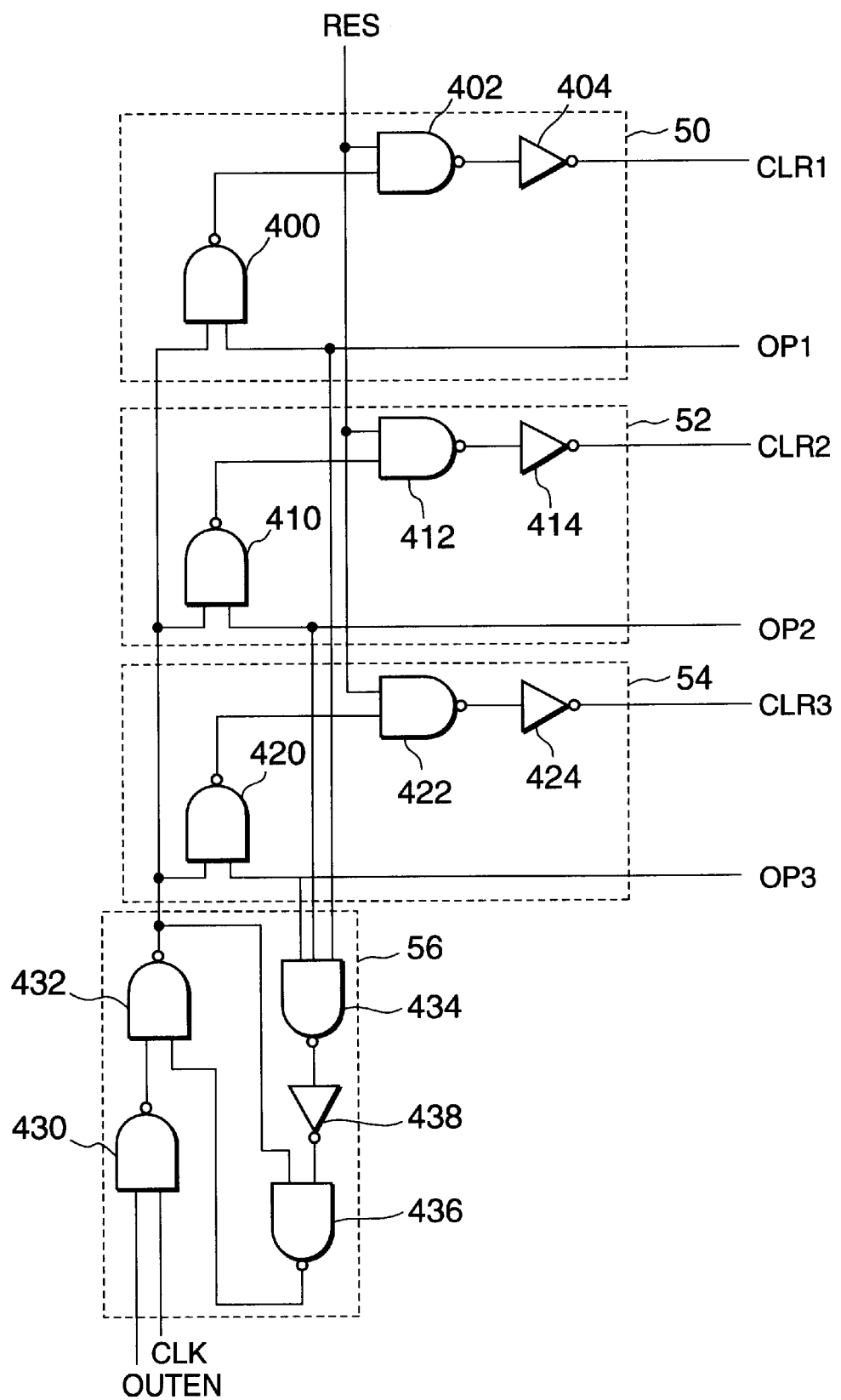
FIG. 5 is a circuit diagram of a clear signal generation circuit shown in FIG. 1.

FIG. 5 shows a circuit configuration of the clear signal generation circuits 50, 52 and 54 as shown in FIG. 1. In FIG. 1, the clear signal generation circuits 50, 52 and 54 are illustrated as three blocks. However, the actual circuits includes a common clear signal circuit 56 and reset signal input node RES.

A first clear signal generation circuit 50 has two NAND circuits 400 and 402 and an inverter 404. A first input terminal of the NAND circuit 400 is connected to a first input node OP1 at which the output signal transferred from the first data existence determination 30 is received. A second input terminal of the NAND circuit 400 is connected to an output terminal of the common clear signal circuit 56. An output terminal of the NAND circuit 400 is connected to a first input terminal of the NAND circuit 402. A second input terminal of the NAND circuit 402 is connected to the reset signal input node RES. An output terminal of the inverter 404 is connected to the first output node CLR1 at which a clear signal is output.

A second clear signal generation circuit 52 has two NAND circuits 410 and 412 and an inverter 414. A first input terminal of the NAND circuit 410 is connected to a second input node OP2 at which the output signal transferred from the second data existence determination 32 is received. A second input terminal of the NAND circuit 410 is connected to the output terminal of the common clear signal circuit 56. An output terminal of the NAND circuit 410 is connected to a first input terminal of the NAND circuit 412. A second input terminal of the NAND circuit 412 is connected to the reset signal input node RES. An output terminal of the inverter 414 is connected to the second output node CLR2 at which a clear signal is output.

A third clear signal generation circuit 54 has two NAND circuits 420 and 422 and an inverter 424. A first input terminal of the NAND circuit 420 is connected to a third input node OP3 at which the output signal transferred from the third data existence determination 34 is received. A second input terminal of the NAND circuit 420 is connected to the output terminal of the common clear signal circuit 56. An output terminal of the NAND circuit 420 is connected to a first input terminal of the NAND circuit 422. A second input terminal of the NAND circuit 422 is connected to the reset signal input node RES. An output terminal of the inverter 424 is connected to the third output node CLR3 at which a clear signal is output.

The common clear signal circuit 56 includes four NAND circuits 430, 432, 434 and 436 and an inverter 438. The output clock signal CLK is applied to a first input terminal of the NAND circuit 430. The output control signal OUTEN is applied to a second input terminal of the NAND circuit 430. An output terminal of the NAND circuit 430 is connected to a first input terminal of the NAND circuit 432. An output terminal of the NAND circuit 432 is connected to the output terminal of the common clear signal circuit 56.

The NAND circuit 434 has first to third input terminals each of which is connected to the first to third input nodes OP1, OP2 and OP3, respectively. An output terminal of the NAND circuit 434 is connected to an input terminal of the inverter 438. An output terminal of the inverter 438 is connected to a first input terminal of the NAND circuit 436. A second input terminal of the NAND circuit 46 is connected to an output terminal of the NAND circuit 432. An output terminal of the NAND circuit 436 is connected to a second input terminal of the NAND circuit 432.

The operation of the clear signal generation circuit will be explained.

First, a reset signal having "L" level is input to the reset signal input node RES when power turns ON. Then, the NAND circuits 402, 412 and 422 output "H" level signals regardless the output signals of the NAND circuits 400, 410 and 420. The "H" level signals output from the NAND circuits 402, 412 and 422 are inverted by the inverters 404, 414 and 424, respectively. Therefore, clear signals having "L" level are output from the first to third output nodes CLR1, CLR2 and CLR3. The reset signal has "H" level except the above situation.

Next, the operation of the clear signal generation circuit will be explained where "L" level signal is applied to the first input node OP1.

Since "L" level signal is applied to the first input node OP1, the NAND circuit 400 outputs "H" level signal regardless the output signal of the common clear signal generation circuit 56. As the NAND circuit 402 receives "H" level signals at its first and second input terminals, it outputs "L" level signal. The "L" level signal is inverted by the inverter 404. Therefore, the clear signal having "H" level is output from the first output node CLR1. The above operation is explained with respect to the first clear signal generation circuit 50. However, the operations of the second and third clear signal generation circuits 52 and 54 are the same manner as the first clear signal generation circuit 50. So, the explanation of the operations of the second and third clear signal generation circuits 52 and 54 are omitted.

The operation of the clear signal generation circuit will be explained where "H" level signal is applied to the first input node OP1.

As explained in the data existence determination circuits, only one of the data existence determination circuits 30, 32 and 34 outputs "H" level signal to the clear signal generation circuit and the other data existence determination circuits outputs "L" level signal to the clear signal generation circuit. In this case, the second and third clear signal generation circuits output the clear signal having "H" level at the output nodes CLR2 and CLR3. As "H" level signal is applied to the first input node OP1 and "L" level signals are applied to the second and third input nodes OP2 and OP3, the NAND circuit 434 of the common clear signal generation circuit 56 outputs "H" level signal. The "H" level signal is inverted by the inverter 438 and then transferred to the first input terminal of the NAND circuit 436. The NAND circuit 436 outputs "H" level signal to the second input terminal of the NAND circuit 432 regardless the level of the signal appeared on the second input terminal thereof.

If either one of the output control signal OUTEN or the output clock signal CLK has "L" level, the NAND circuit 430 outputs "H" level signal. AS the NAND circuit 432 receives "H" level signals at its first and second input terminals, it outputs "L" level signal. At this time, the NAND circuit 400 outputs "H" level signal. AS the NAND circuit 402 receives "H" level signals at its first and second input terminals, it outputs "L" level signal. The "L" level signal is inverted by the inverter 404. Therefore, the clear signal having "H" level signal is output from the first output node CLR1.

If both of the output control signal OUTEN and the output clock signal CLK have "H" level, the NAND circuit 430 outputs "L" level signal. AS the NAND circuit 432 receives "L" level signal at its first input terminal and "H" level signal at its second input terminal, it outputs "H" level signal. At this time, the NAND circuit 400 outputs "L" level signal. AS the NAND circuit 402 receives "L" level signal at its first input terminal and "H" level signal at its second input terminal, it outputs "H" level signal. The "H" level signal is inverted by the inverter 404. Therefore, the clear signal having "L" level signal is output from the first output node CLR1.

That is, during the output control signal has "H" level, the clear signal generation circuit received "H" level signal from the data existence determination circuit outputs the clear signal having "L" level at the rising edge of the output clock signal CLK.

Figure 6:
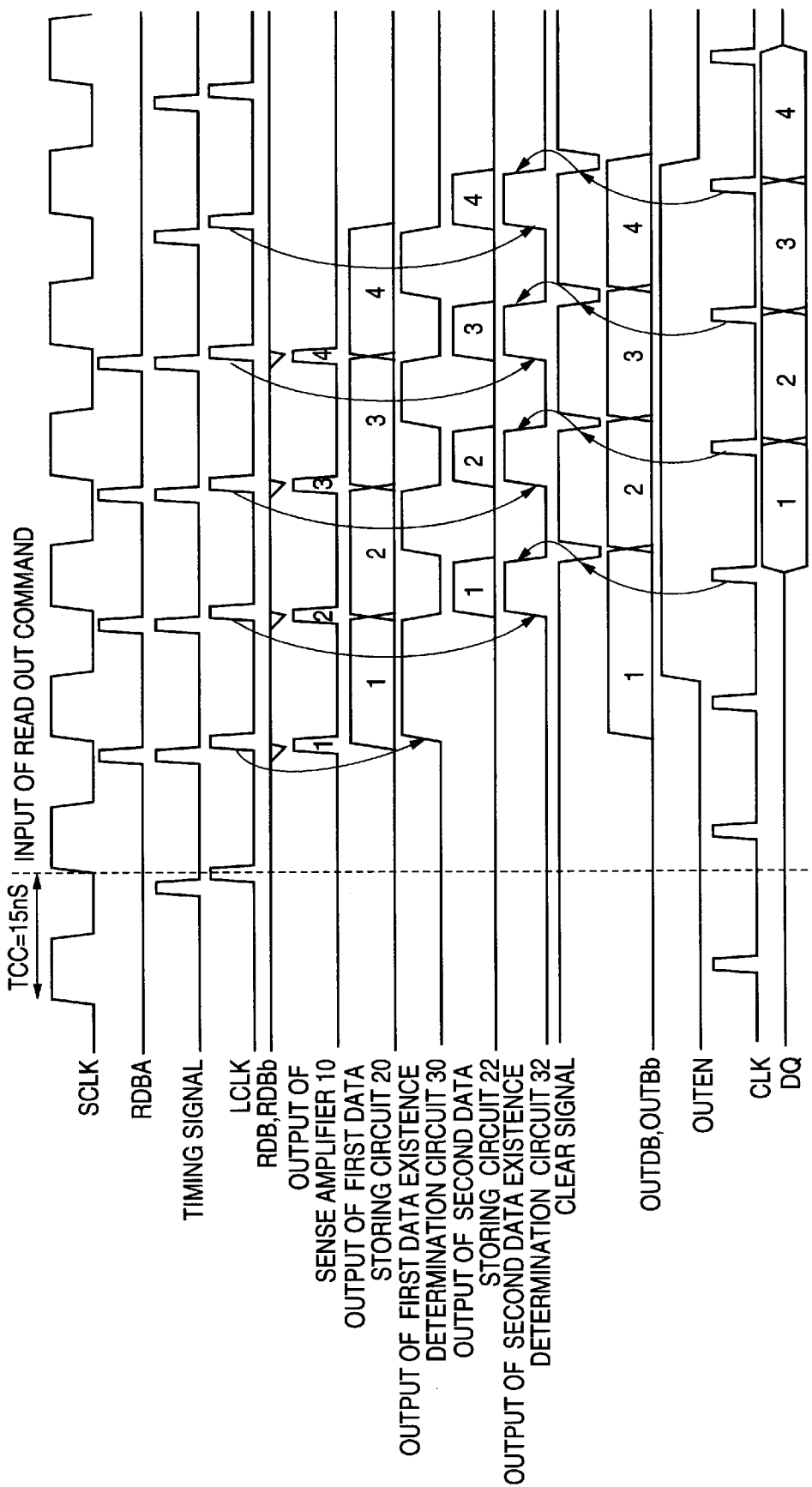
FIG. 6 is a timing chart showing an operation of the semiconductor memory circuit shown in FIG. 1.

The operation of the semiconductor memory circuit of the present invention will be explained with reference of FIG. 6. In the explanation, the CAS latency is three (CL=3).

Since the semiconductor memory circuit of the present invention is used in the SDRAM, the circuit is operated based on the synchronized clock signal SCLK for the SDRAM. The sense amplifier 10 is operably controlled by an activation signal RDBA that is generated from the synchronized clock signal SCLK. When a read out command RC is input to the memory circuit, the activation signal RDBA is output. Therefore, data transferred to read out data bus RDB and RDBb are amplified by the sense amplifier 10 in response to the activation signal RDBA. The amplified data are transferred to the first data storing circuit 20 and the output circuit 60 (see "1" in output of sense amplifier 10). At this time, the output circuit 60 does not output the received data because the output control signal is in "L" level.

The latch clock signal LCLK is generated in response to the leading edge of a timing signal having the same timing of the activation signal RDBA. However, the latch clock signal may have a delayed timing from the activation signal. In this embodiment, since the operation of the sense amplifier is certainly finished at the falling edge of the activation signal RDBA, the latch clock is synchronize with the activation signal and an adjustment of the timing is omitted.

The first data storing circuit 20 stores and outputs the data output from the sense amplifier 10 in response to the latch clock signal LCLK (see "1" in output of the first data storing circuit). The first data existence determination circuit 30 recognizes that the first data storing circuit sores the data, and output the signal to the output control circuit 14, the first data transfer circuit 40 and the first clear signal generation circuit 50. As explained in the circuit of FIG. 3, during a short period of time at which the latch clock signal LCLK turns from "L" level to "H" level, the output signal from the first data storing circuit 30 to the first transfer circuit 40 and the first clear signal generation circuit 50 is stopped. The operation of the other data storing circuit 32 and 34 is the same to the first data storing circuit 30. Therefore, all of the data transfer is inhibited at a moment of the leading edge of the latch clock signal LCLK. The first data transfer circuit 40 transfers the data stored in the first data storing circuit 30 to the output data bus OUTDB and OUTDBb (see "1" in OUTDB, OUTDBb). When the output control signal OUTEN is in "H" level, the output circuit 60 output the data on the output data bus OUTDB and OUTDBb in response to the clock signal CLK which is based on the synchronized clock signal SCLK. However, as shown in FIG. 6, the output control signal is in "L" level and the output of the output circuit 60 is inhibited. Further, the output of the first clear signal generation circuit 50 is also inhibited and the clear signal is not output.

Next data are transferred from the memory cell to the sense amplifier 10 through the read out data bus RDB and RDBb. The data transferred to read out data bus RDB and RDBb are amplified by the sense amplifier 10 in response to the activation signal RDBA. The amplified data are transferred to the first data storing circuit 20 (see "2" in output of sense amplifier 10). The first data storing circuit 20 stores and outputs the data output from the sense amplifier 10 in response to the latch clock signal LCLK (see "2" in output of the first data storing circuit). At that time, the second data storing circuit 22 stores and outputs the data output from the first data storing circuit 20 in response to the latch clock signal LCLK (see "1" in output of the second data storing circuit).

The second data existence determination circuit 32 recognizes that the second data storing circuit 22 stores the data and outputs the signal to the first data existence determination circuit 30. After the leading edge of the latch clock signal LCLK, The second data existence determination circuit 32 further outputs the signal to the second transfer circuit 42 and the second clear signal generation circuit 52. The first data existence determination circuit 30 recognizes that the second data storing circuit 20 stores the data. However, The first data existence determination circuit 30 does not output the signal to the output control circuit 14, the first transfer circuit 40 and the first clear signal generation circuit 50 because it receives the signal from the second data existence determination circuit 32.

The second data transfer circuit 42 transfers the data stored in the second data storing circuit 32 to the output data bus OUTDB and OUTDBb. However, the data have already transferred from the first data storing circuit 20 to the output data bus OUTDB and OUTDBb. Therefore, it seems that the data are continuously transferred to the output data bus OUTDB and OUTDBb (see "1" in OUTDB, OUTDBb). At this time, as the output control signal OUTEN is in "H" level, the output circuit 60 output the data on the output data bus OUTDB and OUTDBb to the data output terminal DQ in response to the output clock signal CLK. On the other hand, the second clear signal generation circuit 52 outputs the clear signal to the second data storing circuit 32 in response to the output clock signal CLK. Therefore, the second data storing circuit erase the stored data in response to the clear signal. The second data existence determination circuit 32 recognizes that the second data storing circuit does not store the data. Therefore, the second data existence determination circuit 32 stop outputting signal to the first data existence determination circuit 30, the second transfer circuit 42 and the second clear signal generation circuit 52. The second transfer circuit 42 disconnects the second data storing circuit 32 from the output data bus OUTEDB and OUTDBb.

On the other hand, the first data existence determination circuit 30 which recognizes that the first data storing circuit 20 stores the data outputs the signal to the output control circuit 14, the first transfer circuit 40 and the first clear signal generation circuit 50 because no signal is received from the second data existence determination circuit 32. Then, the first transfer circuit 40 transfer the data stored in the first data storing circuit 20 to the output data bus OUTDB and OUTDBb. Therefore, next data is transferred to the output data bus OUTDB and OUTDBb at this time (see "2" in OUTDB, OUTDBb). The above operations are repeated a certain times.

As explained above, the data read out from the memory cell are output from the data output terminal after the read out command is input and in accordance to the CAS latency. A setting up of the CAS latency is determined by the timing of the output control signal OUTEN. In the above embodiment, the CAS latency is set up at three (CL=3) and the data are output after two pulses of the output clock signal are passed from the input of the read out command signal RC. If the CAS latency is set up at four (CL=4), the data are output after three pulses of the output clock signal are passed from the input of the read out command signal RC.

In the above embodiment, the semiconductor memory circuit is controlled by the leading edge of the output clock signal. However, the semiconductor memory circuit may be controlled by both the leading edge and falling edge of the output clock signal CLK. In this case, the output clock signal having a constant pulse width such as synchronized clock signal is desired. Of course, CL=0.5, CL=1.5 or other CAS latency can be set up in this case.

Further, the above embodiment shows the semiconductor memory circuit having three sets of the data storing circuit, the data existence determination circuit, the transfer circuit and the clear signal generation circuit. However, a number of set of the circuits may be increased for corresponding to a large number of CAS latency.

As explained above, the semiconductor memory circuit of the present invention has delayed timing between the output control signal and the latch clock signal. Therefore, a high speed operation can be realized even if the clock cycle become short. Further, the semiconductor memory circuit of the present invention can be respond both of the leading edge and falling edge of the clock signal.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory circuit comprising:

a sense amplifier amplifying data read out from a memory cell;

a first data storing circuit for temporally storing and outputting the data from said sense amplifier in response to a latch signal, said first data storing circuit erasing the stored data in response to a first clear signal;

a first determination circuit coupled to said first data storing circuit for determining whether said first data storing circuit stores the data, said first determination circuit outputting a first determination signal representing the determination;

an output data bus;

a first transfer circuit coupled to said first data storing circuit, said first determination circuit and said output data bus, said first transfer circuit transferring the data output from said first data storing circuit to said output data bus in response to the first determination signal;

a first clear signal generation circuit coupled to said first determination circuit and said first data storing circuit for generating the first clear signal in response to the first determination signal;

a second data storing circuit for temporally storing and outputting the data output from said first data storing circuit in response to the latch signal, said second data storing circuit erasing the stored data in response to a second clear signal;

a second determination circuit coupled to said second data storing circuit for determining whether said second data storing circuit stores the data, said second determination circuit outputting a second determination signal representing the determination;

a second transfer circuit coupled to said second data storing circuit, said second determination circuit and said output data bus, said second transfer circuit transferring the data output from said second data storing circuit to said data bus in response to the second determination signal; and a second clear signal generation circuit coupled to said second determination circuit and said second data storing circuit for generating the second clear signal in response to the second determination signal.

2. A semiconductor memory circuit according to claim 1, further comprising an output circuit coupled to said output data bus and said output control circuit, said output circuit outputting the data from said output bus in response to the output control signal.

3. A semiconductor memory circuit according to claim 1, further comprising an output control circuit receiving an enable signal and a clock signal and generating the latch signal and an output control signal in response to the received signals thereto.

4. A semiconductor memory circuit according to claim 3, wherein said first clear signal generation circuit generates the first clear signal in response to the first determination signal and the output control signal, and wherein said second clear signal generation circuit generates the second clear signal in response to the second determination signal and the output control signal.

5. A semiconductor memory circuit according to claim 3, wherein said output control circuit further generates an internal clock signal in response to the clock signal.

6. A semiconductor memory circuit according to claim 5, wherein said first clear signal generation circuit generates the first clear signal in response to the first determination signal, the output control signal and the internal clock signal, and wherein said second clear signal generation circuit generates the second clear signal in response to the second determination signal, the output control signal and the internal clock signal.

7. A semiconductor memory circuit according to claim 5, further comprising an output circuit coupled to said output data bus and said output control circuit, said output circuit outputting the data from said output bus in response to the output control signal and the internal clock signal.

8. A semiconductor memory circuit comprising:
a sense amplifier amplifying data read out from a memory cell;
a plurality of latch circuits serially connected each other, said latch circuits including a first latch circuit and a plurality of dependent latch circuits, said first latch circuit receiving and outputting the data from said sense amplifier in response to a latch signal, said dependent latch circuits latching and outputting the data from one of said latch circuit in response to the latch signal, each of said latch circuits erasing the latched data in response to a clear signal;
a plurality of determination circuits each of which is connected to one of said latch circuits for determining whether the one of said latch circuits stores the data, each of the determination circuits outputting a determination signal representing the determination;
a data bus;
a plurality of transfer circuits each of which is connected to one of said latch circuits, one of said determination circuits and said data bus, said transfer circuits transferring the data from the latch circuits to said data bus in response to the determination signals; and
a clear signal generation circuit coupled to said latch circuits and said determination circuits for generating the clear signal in response to the determination signals.

9. A semiconductor memory circuit according to claim 8, further comprising an output control circuit for receiving a clock signal and an enable signal and for generating the latch signal and an output enable signal in response to the received signals thereto.

10. A semiconductor memory circuit according to claim 9, wherein said clear signal generation circuit generates the clear signal in response to the determination signals and the output enable signal.

11. A semiconductor memory circuit according to claim 9, further comprising an output circuit coupled to said data bus and said output control circuit, said output circuit outputting the data on said data bus in response to the output enable signal.

12. A semiconductor memory circuit according to claim 9, wherein said output control circuit further generates an internal clock signal in response to the received signal thereto.

13. A semiconductor memory circuit according to claim 12, wherein said clear signal generation circuit generates the clear signal in response to the determination signals, the output enable signal and the internal clock signal.

14. A semiconductor memory circuit according to claim 12, further comprising an output circuit coupled to said data bus and said output control circuit, said output circuit outputting the data on said data bus in response to the output enable signal and the internal clock signal.

* * * * *